July 8, 1969 R. J. ROCKWELL 3,454,790

SIMULATED SINUSOIDAL DIODE CLIPPER

Filed Aug. 16, 1965

INVENTOR
RONALD J. ROCKWELL

BY Alden D. Redfield
Charles M. Hogan
ATTORNEYS.

3,454,790
Patented July 8, 1969

3,454,790

SIMULATED SINUSOIDAL DIODE CLIPPER

Ronald J. Rockwell, Cincinnati, Ohio, assignor to Avco Broadcasting Corporation, a corporation of Ohio Filed Aug. 16, 1965, Ser. No. 479,727
Int. Cl. H03k 5/08
U.S. Cl. 307—237 5 Claims

ABSTRACT OF THE DISCLOSURE

This is a circuit which prevents overmodulation in a transmitter by clipping over-shoots without introducing audible distortion. It is used with an alternating current audio amplifier which operates at a predetermined peak voltage level and it comprises a series chain of silicon diodes of one polarity and another series chain of silicon diodes of the opposite polarity. Both chains are in shunt relationship to the output of the amplifier. Inserted in series between the diode chains and the amplifier is resistance in the form of a plurality of parallel tungsten lamps and means for protecting those lamps against overload. The number of diodes in each chain is such that the threshold of conductivity of each chain approximates the predetermined level mentioned above. Further, the amplitude-time wave form characteristics of each chain approximates a series of sinusoidal half waves having a peak amplitude at said level.

The present invention relates to clipping circuits and, while not confined to utility therewith, it is of particular advantage as employed in the audio amplifying system of an amplitude modulated broadcast transmitter.

The transmitted volume range of a given broadcast program, such as a rendition of a symphony orchestra, is usually less than the volume range of the original program. It is customary in broadcasting practice for the audio control operator to adjust the gain of the audio amplifying system in such a way that the fortissimo parts of a program are reduced and the pianissimo parts are increased. The principal reasons for this practice are as follows: first, to prevent the fortissimo parts of the program from being too loud for the ear and the taste of the listening audience at the receiving stations; second, to conform to the permissible volume range for the types of broadcast and receiving equipments generally used, which volume range approximates 50 decibels.

In other words, it is desirable to increase the percentage of modulation for the pianissimo parts and to prevent the fortissimo parts from overmodulating, this latter for the reason that overmodulation causes distortion and is contrary to good broadcasting practice as prescribed by the Federal Communications Commission.

For the above and other reasons the broadcasting art has addressed itself to the provision of circuits for automatically controlling and compressing a range of audio input circuit signals. In United States Patent 3,003,116, R. J. Rockwell, issued Oct. 3, 1961, entitled "Automatic Gain Control Amplifier" and assigned to Crosley Broadcasting Corporation, there is disclosed an automatic amplifier which automatically performs the various gain controlling functions which heretofore required a manual operator. For purposes of brevity this automatic amplifier is herein referred to as the "Rockwell Amplifier."

Prior to the development of the art to the stage represented by the Rockwell Amplifier, the widespread practice of manually turning down the gain of the transmitter to prevent overloading and overmodulation resulted in such conditions that a typical clear-channel 50,000 watt broadcasting station generally operated commercially with approximately 20% average modulation. For purposes of discussion this state of the art will be referred to as the "manual phase." A substantial improvement resulted from advances to the state of the art including the Rockwell Amplifier in that an automatic amplifier with six decibels of compression results in an average modulation of approximately 40%. The significance of these figures is that a 50 kilowatt transmitter in the later state of the art, hereinafter referred to as the "automatic phase," produces the same average transmitted signal power as a hypothetical 200 kilowatt station would have produced operating with average modulation of 20%. The transition from the manual phase to the automatic phase therefore represented an average signal power improvement on the order of 400%. The present invention provides a still further advance in that amplifying equipment incorporating the invention can be operated with an average modulation of approximately 70%, which represents a further and in fact a 3–1 improvement in average transmitted signal power. That is to say, a 50 kilowatt transmitter provided with the Rockwell Amplifier, for example, and a simulated sinusoidal diode clipper in accordance with the present invention produces the same signal power that would have been produced by a 600 kilowatt transmitter at the manual phase of development of the art and a 200 kilowatt transmitter at the automatic phase of the art.

An object of the present invention is to provide improved clipper circuitry, for incorporation in audio amplifying systems for amplitude modulation broadcasting, which makes practical operation at an average modulation of 70%, without introducing any substantial distortion and at the same time providing substantial insurance against overmodulation.

Another object of the invention is to provide an improved diode clipper circuit which as installed in the audio amplifying system of a transmitter accomplishes an improvement of 3–1 in average transmitted signal power over that represented by the Rockwell Amplifier and the state of the art which it represents.

Before discussing a more specific and major object of the invention, a problem characterizing the automatic phase of the art is mentioned.

Most automatic amplifiers, including the Rockwell Automatic Amplifier, incorporate fairly fast gain reduction and can control midrange frequencies without substantial distortion or over-shoot. However, over-shoots are caused by sounds characterized by a fast attack, such as consonants in speech and plucked string instruments. It is advantageous to clip these over-shoots until the fast time constant circuits in the amplifying system can begin to perform. However, clipper circuits known in the art to be of utility in this kind of environment produce square top waves. Even though such waves satisfy one requirement (i.e. over-shoot elimination) in that they are of uniform height, this square wave form introduces a series of harmonics which cause intolerable distortion (FIG. 2). I have found in experiments with the Rockwell Amplifier that some improvement is achieved by the provision of resistance in circuit with a clipping diode, in the sense that the tops of the clipped waves are somewhat rounded, but the successive clipped waves are of non-uniform amplitude (FIG. 3). Therefore the provision of resistance is only a partial solution to the problem.

It will be understood from the foregoing discussion that this problem is a very serious one in that actual broadcasting practice has heretofore involved such precautions against overmodulation that broadcasting stations are operated at a 40% average modulation, with resultant sacrifice in transmitted signal power. This practice is in a sense analogous to the operation of a three-speed automobile in second gear on a level road, assuring the engine against overloading but not at all realizing the full potentials of the engine.

Accordingly, an object of the invention is to provide a circuit which clips such over-shoots without introducing audible distortion (FIG. 4).

For a better understanding of the present invention, together with other and further objects, advantages, and capabilities thereof, reference is made to the following description of the appended drawings, in which.

Figure 1:
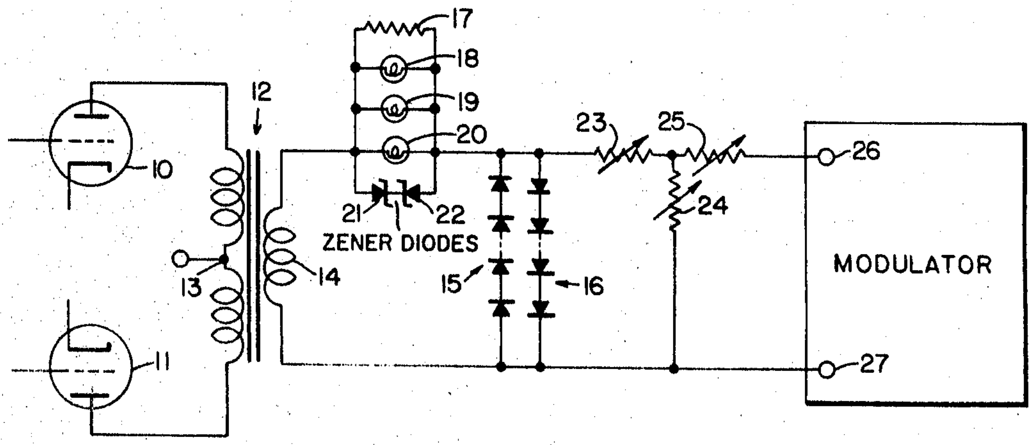
FIG. 1 is a circuit schematic of a preferred embodiment of simulated sine wave peak clipper in accordance with the invention.

Referring now specifically to FIG. 1, a specific embodiment of the invention is illustrated as coupled between the output or power tubes of an audio amplifying system and the modulator stage of a conventional amplitude modulation broadcast transmitter. The output stage of the amplifier comprises a pair of vacuum tubes 10 and 11, the anodes of which are connected to the end terminals of the primary of an iron-core transformer 12, which has a secondary 14.

The heart of the invention resides in the two series strings of diodes 15 and 16 each connected in shunt across the audio output channel, the polarities of the diodes in spring 15 being opposite to the polarities of the diodes in string 16. Interposed between the shunt diode strings and the secondary 16 is a parallel combination of a resistor 17, a plurality of tungsten lamps 18, 19, and 20, and a series pair of oppositely poled Zener diodes 21 and 22.

The output of the channel comprises a variable T-pad attenuator consisting of series rheostat 23, shunt rheostat 24, and series rheostat 25. The output is conductively brought out to input terminals 26 and 27 of the modulator.

Deferring for the moment further consideration of the elements 17–22, attention is directed to the fact that the following elements of FIG. 1 herein correspond to these elements of the Rockwell disclosure of the aforesaid United States Patent 3,003,116:

| Present disclosure: | Rockwell Patent |
|---|---|
| Tubes **10** and **11** ________ | The amplifier output tubes. |
| Variable T-pad **23–25** ___ | The variable T-pad. |
| Output transformer **12**___ | The audio output transformer. |

The present invention is accomplished primarily by the insertion of two oppossed diode strings in series across the over-all output of an audio amplifier, preferably an amplifying system as shown in Rockwell Patent 3,003,116, although it should be understood that the invention is not limited to utility in that environment.

Referring now to the three miniature tungsten lamps 18–20, these function as an attenuator circuit and insert additional loss as the signals presented to the two diode strings 15, 16 increase in amplitude. The lossy response of lamps 18–20 is very fast, and I prefer to employ miniature lamps each of 10 volt capacity, 0.015 ampere. A characteristic of such lamps is that they increase very rapidly in resistance as current through them is increased. Resistor 17 is of approximately 500 ohms. The purpose of the opposed Zener diodes 21 and 22 is to accept surge currents and prevent accidental burnout of the lamps. The elements 21, 22 are 8 volt diodes. The purpose of the 500 ohm resistor is to keep the circuit of elements 17–22 closed below Zener conduction in the event the filaments of the lamps should open. Three lamps in parallel are employed in order to increase the speed of resistance change relative to one lamp of the equivalent resistance.

In utilizing the invention with a Rockwell Amplifier with the parameters mentioned in the aforesaid patent, I prefer to use thirteen diodes in string 15 and thirteen diodes in string 16. The number of diodes is determined by the conduction characteristic of each and by the output level of the amplifier. For example, when using Type 1N2071 diodes, the over-all threshold voltage of each diode string is 6.5 volts, approximately 0.5 volt per diode. This prevents conduction below an out level of 6.5 volts. The normal audio output of the Rockwell Amplifier (except for high frequency over-shoots of the type under consideration) is at a 6.5 volt level. The result of maximum utility is provided with diodes sufficient in number and having such characteristics that, in the present combination, their threshold of conduction approximates the voltage output level of the amplifier.

Figure 2:
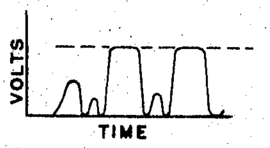
FIGS. 2, 3 and 4 are voltage amplitude vs. time wave forms which show wave forms as follows: first, those produced by diode clippers; second, those produced by diode clippers and resistance in series; and third, those which characterize the present invention.

FIG. 2 illustrates, in a framework of Cartesian coordinates, with amplitude for ordinate and time for abscissa, a prior art waveform representing the clipped output of a typical single diode. Note the square wave shape which has been previously mentioned.

Figure 3:
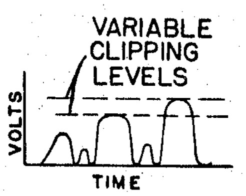

Refer now to FIG. 3 for the wave shapes produced by a single diode in a series combination with resistance and inserted in shunt across the output of a Rockwell Amplifier. While there is some improvement of the wave shape and less introduction of distortion, the requisite uniformity of amplitude of the successive partially-rounded-top waves is not supplied.

Figure 4:
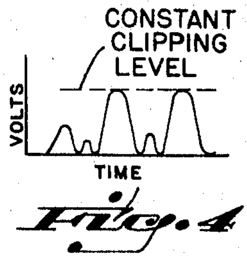

Now, when diodes are arranged in series, the curvatures of condition of the diodes are additive during limiting, and this results in a sinusoidal waveform as per FIG. 4 in a circuit in accordance with the invention. That is, a sufficient number of diodes are inserted in chain 16, for example, to provide an over-all output waveform (for over-shoots of one polarity) as per FIG. 4. Note the contrast between this sinusoidal waveform (FIG. 4) and the characteristic square wave top (FIG. 2) produced by conventional back-biased diode limiters.

While the result produced by the diode strings in accordance with the present invention is highly desirable, there is a slight limitation in that the higher the diode current, the poorer is the simulation of half of a sine wave by the output waveform of each chain. The provision of the series resistance by the circuit 17–19 improves the simulation because the series resistance increases with current.

The invention above disclosed accomplishes the following useful results: (1) It is characterized by lower distortion when the limiting action is occurring; (2) It reduces the peak voltage during diode limiting; and (3) It permits raising the average modulation.

The comparison of the transmitted power accomplished during the manual phase, during the automatic phase, and with the present invention postulated the same signal-to-noise ratio under each of the compared conditions. It will be understood that the chain 16 simulates one half of a sine wave and the chain 15 simulates the other half of a sine wave, so that the resultant is a simulated sine wave without the introduction of harmonics.

Figure 5:
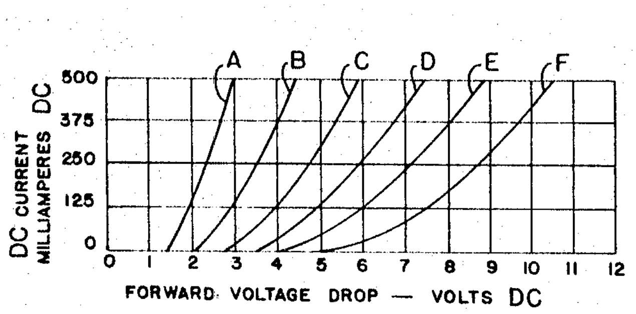
FIG. 5 is a set of voltage-current characteristic curves used in explaining the operation of the invention.

Referring now to the curves of FIG. 5, they show diode characteristics on a Cartesian frame of coordinates in terms of current as ordinates and volts as abscissae. The curves lettered A, B, C, D, E, and F show, progressively, the characteristics of chains of three, four, five, six, seven, and eight diodes, respectively.

A comparison of these curves reveals that increases in the number of diodes in a series chain produce progressively increasing curvatures. Let curve A be considered first. The significance of curve A is that, once the threshold of conductivity is attained, increments of current with increments of voltage are relatively large. In the case of a single diode, a curve analogous to A and beyond the threshold of conductivity would approximate a straight vertical line, so that the behavior of the diode would approximate a short-circuit, and such vertical line is the reason for the well-known square wave output of the conventional diode clipper. Now, however, examining curve F, it will be found that as current increases the slope of the curve increases. In other words, a chain of diodes produces an exponentially reducing resistance characteristic and therefore simulates a sinusoidal wave form.

It will be understood that, on successive half waves of over-shoot cycles, the diode chain 16 output is in accordance with FIG. 4. The chain 15 produces the inverse of the FIG. 4 wave forms on the alternate successive half cycles, whereby a train of complete approximately sinusoidal wave forms comprises the output of the over-all system illustrated in FIG. 1. It should be noted that the peak level of these wave forms is approximately constant and equal to the normal peak amplifier output with steady tones. The over-shoots have been eliminated, and in such a manner as not to introduce substantial distortion.

The high frequency components characterizing fast attack portions of music and speech consist primarily of noise. The sinusoidal clipping action is only on the order of microseconds in duration and it occurs during this noise so that it is in effect swamped out. Because of this swamping action and brevity of duration, any incidental minor distortion due to the action of the clipping circuit is accordance with the inventon is inaudible and therefore negligible.

It will be understood that a resistor of, say, 50 ohms—again by way of illustration and not of limitation—may be substituted for the circuit 17–22.

The considerations controlling the number of diodes in each chain have been given. Knowing the characteristics of diodes, knowing further from this disclosure that the conductivity of each chain should approximate the peak voltage level of the amplifier, and knowing further from this disclosure that increases in the number of diodes in each chain render the wave form progressively more sinusoidal in character, those skilled in the art, with this disclosure before them and in the light of the teachings of this disclosure, will readily be able to practice the invention and provide numbers of diodes optimized for particular applications.

The purpose of the elements 17–22 is to prevent the primary from being presented with an unduly low transient reflected load during the time that the diode chains are conductive. The diode chains, in and of themselves, constitute a very low resistance shunt. That is to say, in the absence of the elements 17–22, or a 50 ohm resistor which may be employed in lieu thereof, the secondary circuit would unduly load the primary during over-shoots. It is desirable to prevent such undue loading in order not to disturb the sampling action in the primary circuit. It will be recalled from the aforesaid Rockwell patent that the primary circuit is sampled to derive gain control voltage.

Another purpose of elements 17–22, or a 50 ohm resistor in lieu thereof, is to function as a series current limiting device as far as the current carried by the diode chains 15, 16 is concerned.

While the parameters herein mentioned are furnished by way of illustration and not of limitation, the following have been found satisfactory in one working embodiment of the invention:

| | |
|---|---|
| Diodes **21** and **22** | Each 8 volts. |
| Lamps **18, 19**, and **20** | Chicago miniature lamps, 10 volts, 0.015 ampere. |

| | |
|---|---|
| Load presented by modulator | 500 ohms. |
| Silicon diodes in chains **15** and **16** | Type 1N2071. |
| Cold resistance of lamps **18–20** | Approximately 50 ohms. |
| Resistor **17** | 500 ohms. |
| Rating of variable T-pad **23, 24, 25** | 500 ohms. |

The significance of the last-mentioned rating is as follows: All of the rheostat arms of the three rheostats in the variable T-pad are ganged. Now, since the diode strings are followed by a 500 ohm variable T-pad and a 500 ohm load, an effective load of 500 ohms will be seen across the diode strings at all positions of the variable T-pad. This condition is preferred in order to optimize the clipping point of the diode chains with respect to amplifier output level.

The circuit in accordance with the present invention produces no audible distortion during diode limiting. A Rockwell Amplifier improved by the present invention measures less than 0.25% distortion through a frequency range extending from 20 to 20,000 cycles per second. The circuitry permits 70% average modulation. In order to accomplish 70% average modulation without this circuit, in conventional broadcasting practice, it is necessary illegally to over-modulate the transmitter, thus producing objectionable distortion and radiation.

I claim:

1. A clipping circuit for use with an alternating current audio amplifier operating at a predetermined peak voltage level, which comprises, in combination:
   a series chain of diodes of one polarity in shunt relation to the output of said amplifier and a series chain of diodes of the opposite polarity also connected in shunt to said output;
   each diode having a predetermined level of conductivity and the number of diodes in each chain being sufficiently large so that the threshold of conductivity of each chain approximates said level and so that the amplitude-time wave form characteristics of each chain approximate a series of sinusoidal half waves of which the peak amplitude approximates said level;
   and resistance inserted in series between the diode chains and said audio amplifier, said resistance having the characteristic of an increase in resistance with current.

2. A clipping circuit in accordance with claim 1 in which the diodes in the chain are silicon diodes.

3. A clipping circuit in accordance with claim 2 in which the silicon diodes are Type 1N2071 and in which the number of diodes in each chain is thirteen.

4. A clipping circuit in accordance with claim 3 in which the resistance comprises a plurality of parallel tungsten lamps, and means for protecting said lamps against overload.

5. The combination of:
   a load having a constant resistance characteristic,
   an automatic alternating current audio amplifier operating at a predetermined peak voltage level, and
   a clipping circuit between said amplifier and said load, and series resistance between said amplifier and said clipping circuit, said clipping circuit comprising:
      a series chain of diodes of one polarity in shunt relation to the output of said amplifier and
      a series chain of diodes of the opposite polarity also connected in shunt to said output;
      each diode having a predetermined level of conductivity and the number of diodes in each chain being sufficiently large so that the threshold of conductivity of each chain approximates said level and so that the amplitude-time wave form characteristics of each chain approximate a series of sinusoidal half waves of which the peak amplitude approximates said level.

(References on following page)

References Cited

UNITED STATES PATENTS

| | | | |
|---|---|---|---|
| 1,364,080 | 1/1921 | Davisson | 338—20 |
| 2,237,448 | 4/1941 | Reinhard | 338—20 XR |
| 2,829,282 | 4/1958 | Hughes et al. | 307—317 XR |
| 2,835,867 | 5/1958 | Golden | 307—317 XR |
| 2,208,933 | 7/1940 | Loewenhaupt | 333—81 |
| 3,231,686 | 1/1966 | Hueber | 307—237 |
| 3,317,668 | 5/1967 | Johnsen | 307—237 |

ARTHUR GAUSS, *Primary Examiner.*

S. T. KRAWCZEWICZ, *Assistant Examiner.*

U.S. Cl. X.R.

307—202, 263, 264; 328—54, 171, 173; 329—134; 332—38